(12) United States Patent
Ruff et al.

(10) Patent No.: US 7,008,233 B1
(45) Date of Patent: Mar. 7, 2006

(54) RETRACTABLE PANEL INTERFACE CABLE DEVICE AND METHOD

(75) Inventors: Brian F. Ruff, Lee's Summit, MO (US); Walter J. Rolston, Overland Park, KS (US); Sheldon T. Wheaton, Olathe, KS (US)

(73) Assignee: Garmin, Ltd., George Town (KY)

( * ) Notice: Subject to any disclaimer, the term of this patent is extended or adjusted under 35 U.S.C. 154(b) by 0 days.

(21) Appl. No.: 10/086,590

(22) Filed: Feb. 28, 2002

(51) Int. Cl.
*H01R 33/00* (2006.01)

(52) U.S. Cl. ..................................... 439/34; 244/118.5

(58) Field of Classification Search ................ 244/1 R, 244/118.5; 108/50.02; 312/223.6; 174/52.1, 174/48–49, 50, 59–60; 211/26; 439/34, 439/595, 660; 307/10.1, 9.1; 361/600, 601, 361/825

See application file for complete search history.

(56) References Cited

U.S. PATENT DOCUMENTS

| | | | |
|---|---|---|---|
| 3,859,724 A * | 1/1975 | Folkenroth .................... 29/867 |
| 4,493,146 A * | 1/1985 | Cronin .......................... 29/857 |
| 4,702,712 A | 10/1987 | Ghorbani et al. |
| 4,736,910 A * | 4/1988 | O'Quinn et al. ............. 244/120 |
| 4,815,984 A * | 3/1989 | Sugiyama et al. ........... 439/211 |
| 4,830,235 A | 5/1989 | Miller |
| 4,871,134 A * | 10/1989 | Oikawa ......................... 248/65 |
| 5,010,642 A * | 4/1991 | Takahashi et al. ............. 29/868 |
| 5,106,033 A * | 4/1992 | Phan .......................... 244/3.12 |
| 5,501,605 A * | 3/1996 | Ozaki et al. .................... 439/34 |
| 5,534,665 A * | 7/1996 | Long .......................... 174/72 A |
| 5,739,470 A * | 4/1998 | Takeda ......................... 174/97 |
| 5,800,208 A * | 9/1998 | Ishizuka et al. ............. 439/557 |
| 5,885,107 A * | 3/1999 | Sluss et al. .................. 439/595 |
| 5,947,753 A | 9/1999 | Chapman et al. |
| 5,993,247 A * | 11/1999 | Kidd .......................... 439/495 |
| 6,102,501 A | 8/2000 | Chen et al. |
| 6,159,030 A * | 12/2000 | Gawron et al. ............. 439/247 |
| 6,257,897 B1 * | 7/2001 | Kubota ......................... 439/34 |
| 6,272,016 B1 | 8/2001 | Matonis et al. |
| 6,535,397 B1 | 3/2003 | Clark et al. |
| 6,592,387 B1 | 7/2003 | Komenda et al. |
| 6,654,253 B1 | 11/2003 | DiMarco |
| 6,695,520 B1 | 2/2004 | Sarno et al. |

FOREIGN PATENT DOCUMENTS

JP          2001-190010 A   * 10/2001

* cited by examiner

*Primary Examiner*—Tien Dinh
(74) *Attorney, Agent, or Firm*—David L. Terrell

(57) ABSTRACT

A device and method for mounting and wiring avionic equipment such as modules and display units in an aircraft is provided. The novel configuration utilizes a flexible guide that routes communication lines from a device such as a display unit to other devices such as avionic modules. Because the flexible guide is only allowed motion in substantially a two dimensional plane, the communication lines routed by the flexible guide are held securely in place before, during, and after any access procedure. Damage or failure of communication lines is prevented by the structural support of the flexible guide, while at the same time, the display unit may be easily removed to allow access to devices such as modules located behind.

10 Claims, 8 Drawing Sheets

RETRACTABLE PANEL INTERFACE CABLE DEVICE AND METHOD

CROSS-REFERENCE TO RELATED APPLICATIONS

This application is related to the following co-pending, commonly assigned U.S. patent applications: "Slide-in Connector Plate for Avionic Unit Rack," Ser. No. 10/086,568, "Electronic Equipment Module Mounting Apparatus and Method," Ser. No. 10/086,482, "System and Method for Mounting Units for an Avionic Display," Ser. No. 10/086, 483, "Electronic Equipment Module Apparatus and Method," each of which the disclosure is herein incorporated by reference in its entirety.

FIELD OF THE INVENTION

The invention relates to mounting devices and methods routing communication lines between devices. Specifically, this invention relates to mounting devices and methods of routing communication lines for avionic equipment in an aircraft.

BACKGROUND OF THE INVENTION

In aviation, there is an increasing presence of computerized and electronic equipment for applications such as instrumentation and navigation. The term avionics refers generally to electronics in an aviation setting. In aviation, electronic sensors are used to monitor airspeed, electronic transmitters are used for communications, and newer applications such as use of global positioning systems (GPS) are being utilized in aircraft of all sizes.

Pricing of equipment for aircraft is competitive, and not all aircraft require the same combination of instrumentation options. To lower costs and to increase the number of end user options, more flexibility in avionic equipment is needed In response to the need for flexibility, the electronic instrumentation industry has evolved to a largely modular system. For example, a communication system, a transponder, and a navigation system are each manufactured in a module. Modules are individually selected for an aircraft based on cost and need for a particular application. The modules are also individually replaceable, which allows aftermarket upgrades, and inexpensive replacement should a single module become damaged.

For convenience, modules are typically mounted near each other in a stack or similar configuration. In many cases, a frame is first mounted to the aircraft, and a number of modules are mounted to the frame. In this configuration, communication lines or wiring are connected directly to each module. In large aircraft, the frame and modules can be located in a more open space, making installation and maintenance easier. However, in small aircraft, and even in large aircraft, space is at a premium. Increasingly, the frame with modules are mounted in less accessible locations to save space. Reduced access locations for modules are increasing the difficultly in installation and maintenance.

To reduce the difficulty in replacing individual modules, some frames that the modules mount to are configured in a mounting system. A typical system includes a number of slots for the modules to slide into. A back plate is usually located at the back of the slots, each back plate typically including a number of electrical sockets such as pin connectors. The modules are installed into the system by sliding them into the slots, where they make contact with the electrical sockets. In this way, once the frame, slots and backplates are installed in an aircraft, replacing individual modules is simply a matter of disengaging any locking mechanism, and pulling them out along the slots, thereby disengaging the modules from the sockets on the backplates.

In addition to the basic mechanical mounting of the modules to a surface or an instrument panel, the modules typically require connection of wiring to transmit data between the module outputs and user interface displays and controls. Because an electrical failure during flight places the aircraft and lives of its passengers at serious risk, extra safety precautions are necessary to protect against electrical failure. In particular, vibration of aircraft during flight gives rise to a significant risk to damage or failure of aircraft wiring. Any configuration of wiring used must design for a level of vibration, and ensure that wiring is well protected against damage or failure. With this goal in mind, the Federal Aviation Administration (FAA) has regulations in place that require all wiring to be securely fastened against vibration.

One current approach to preventing wiring damage has been to utilize numerous cable ties, as are commonly known in the art, every few inches along a wiring group or harness to secure wires together. This configuration helps keep wires from rubbing against each other. In addition, the wires or wire harnesses have been secured to brackets or fixed structures in the aircraft along their path from one device to another. Typically this securement is also accomplished with cable ties.

One problem with this approach has been that any re-wiring work required the cutting of numerous cable ties, and the re-fastening of the cable ties after work is completed. Even if new wires are not required, certain devices such as avionic display or control units sometimes need to be removed from their attached surface for access to other devices that may be located nearby behind, for example, a crowded cockpit instrument panel. In this case, the associated wiring for the display needs to be loosened from at least some of its secured locations by cutting cable ties and re-securing the wires when the display is re-attached.

What is needed is a device for wiring and an associated method that allows easy access to wiring without the need for cutting and re-installing cable ties. What is also needed is a device and an associated method that allows easy replacement of communication lines such as wires. What is also needed is a device and an associated method that holds wires securely and protects them to prevent damage or failure of communication lines or a their associated fixtures such as pin connectors or the like.

SUMMARY OF THE INVENTION

The above mentioned problems with access and repair or replacement of avionic equipment are addressed by the present invention and will be understood by reading and studying the following specification. Systems, devices and methods are provided for mounting various configurations of avionic equipment. The systems, devices, and methods of the present invention offer easier access to equipment while at the same time maintaining secure mounting to prevent damage or failure of communication lines.

An avionic wiring system is provided. The wiring system includes a flexible guide adapted for connection between a first device and a second device, wherein the flexible guide limits communication line movement to substantially a two dimensional plane.

A method of mounting an avionics instrument system is also provided. The method includes attaching an electronic module to a mounting surface, and coupling a display unit to the electronic module using at least one communication line. The method also includes routing the communication line along a flexible guide coupled between the electronic module and the display unit, wherein the flexible guide limits communication line movement to substantially a two dimensional plane.

A method of manufacturing an avionics instrument system is also provided. The method of manufacture includes forming an electronic module adapted for attachment to a mounting surface and forming a display unit. The method further includes coupling the display unit to the electronic module using at least one communication line. The method also includes forming a flexible guide and coupling the flexible guide between the electronic module and the display unit, wherein the flexible guide limits communication line movement to substantially a two dimensional plane.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
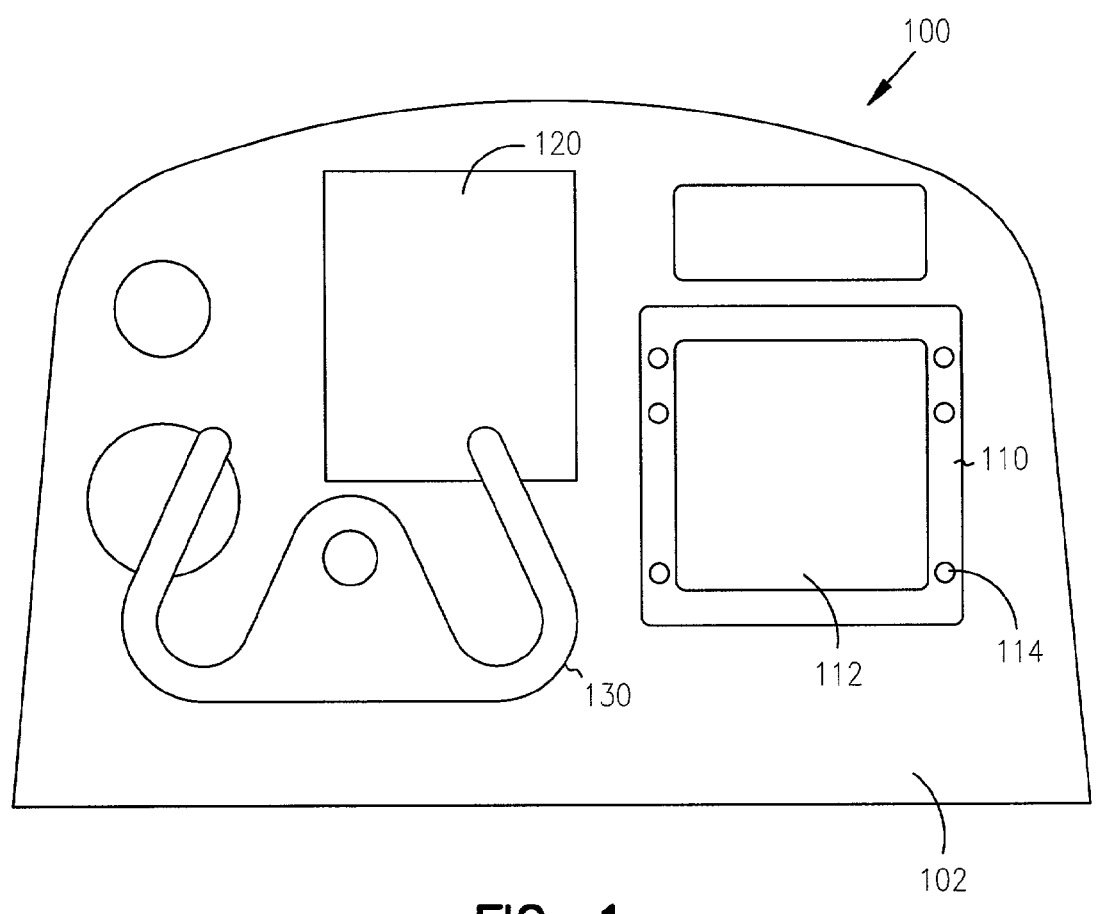
FIG. 1 shows a front view of a cockpit instrument panel.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

References to directions, such as up, down, above, or below, etc. will have their normal meaning with the ground being downward when referring to embodiments not used in aircraft. When referring to embodiments mounted to an aircraft, downwards will refer to the direction towards a bottom surface of the airplane, regardless of the orientation of the airplane during flight. When referring to embodiments of the invention that are mounted adjacent to a mounting surface, such as an airplane instrument panel, references to in front of the panel will refer to a side of the panel that is operator accessible, while behind the panel will refer to the opposite side of the panel facing away from the operator, or that is normally towards the nose of the aircraft, and not easily accessible to an aircraft operator.

In the following disclosure, for ease of description, the term wiring will be used to describe communication lines themselves, or the act of installing communication lines. One skilled in the art will recognize that wiring includes electrical communication lines and any of a number of alternative communication lines such as fiber optic lines.

In one embodiment, the following device and method for mounting an avionic instrument system is used in an aircraft, and is attached to a mounting surface within the aircraft. Although this setting is used as an example, the mounting system described can be used in other settings as well without departing from the scope of the invention.

FIG. 1 shows a typical aircraft cockpit 100. A yoke 130 is shown, attached to an instrument panel surface 102. Also located on the instrument panel surface 102 is an avionic display 110. In one embodiment, the avionic display 110 includes a screen 112 and a number of controls 114 that relate to the data being displayed on the screen 112. Other instrumentation 120 may also be located on the instrument panel surface 102. Following Figures are related to a mounting system that is adapted for use with electronic modules that provide information to displays such as display 110 shown in FIG. 1.

Figure 2A:
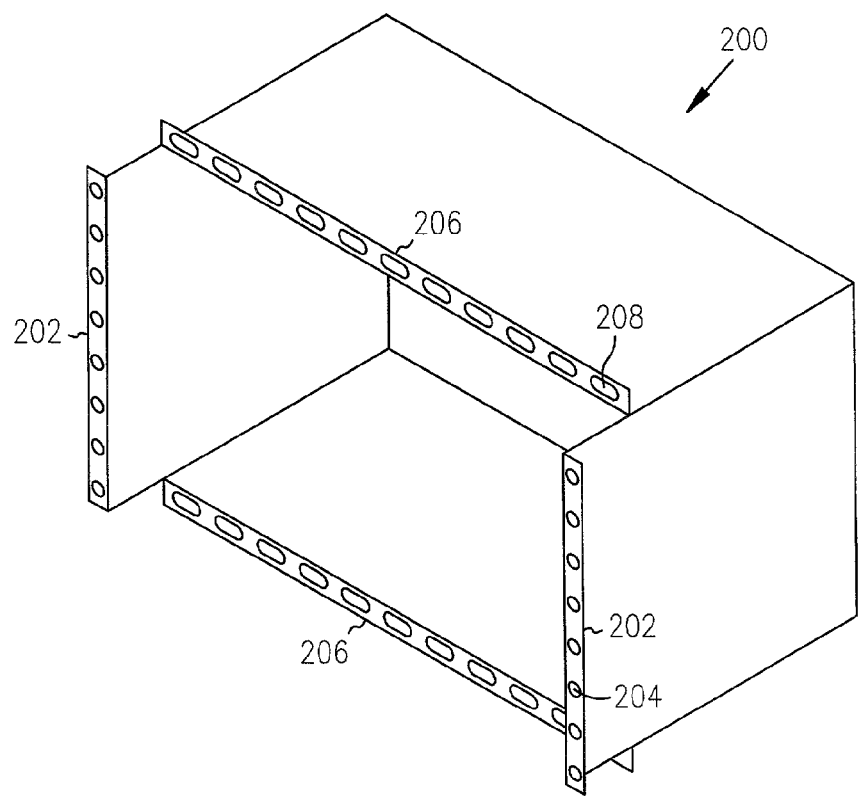
FIG. 2A shows a perspective view of a mounting frame according to the invention.

FIG. 2A shows a mounting frame 200. The mounting frame includes a pair of first mounting surfaces 202, each with a first plurality of mounting options 204. The mounting frame 200 also includes a pair of second mounting surfaces 206, each with a second plurality of mounting options 208. In one embodiment, the first and second plurality of mounting options 204 and 208 include an array of openings adapted to accept screws. Other fastening devices such as rivets are also contemplated. One skilled in the art will recognize that slots or holes are alternate options for mounting openings.

While in one embodiment, pairs of mounting surfaces are shown on opposing sides of the mounting frame 200, it is understood that other configurations of mounting surfaces are contemplated, such as one mounting surface, more than a pair of mounting surfaces, or mounting surfaces that are not on opposing sides. Likewise, the first and second plurality of mounting options 204 and 208 are only necessary with certain fastener configurations. One skilled in the art will also recognize that instead of screws, alternate fasteners such adhesives could also be used without departing from the scope of the invention.

Figure 2B:
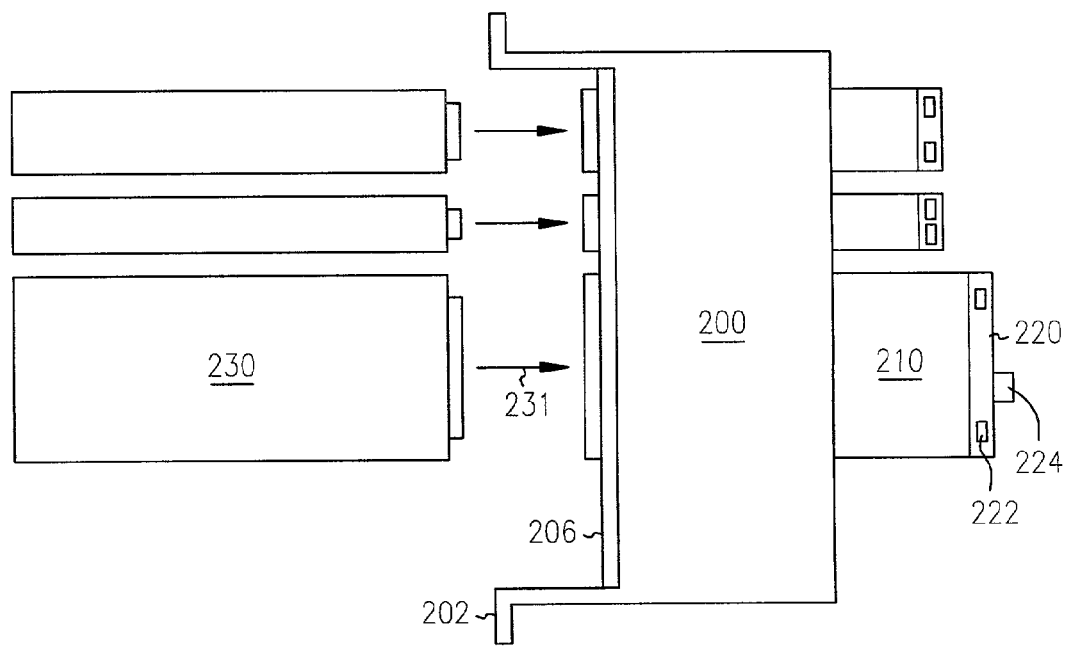
FIG. 2B shows a top view of an embodiment of a mounting system according to the invention.

FIG. 2B shows a number of unit frames 210. Each unit frame includes a back plate 220 that is secured to the unit frame 210 by a fastener 222. The back plate 220 in one embodiment further includes an electrical connector 224 such as a pin connector. The unit frames 210 are attached to the second mounting surface 206 of the mounting frame 200. In one embodiment, the unit frames 210 are attached in a vertical orientation to provide horizontal flexibility of installation space. Electronic modules 230 are shown as insertable along arrow 231 into the unit frames 210. Electronic modules may include, but are not limited to examples such as a communication device, a transponder, or a global positioning system (GPS). In one embodiment, each unit frame 210 is specifically sized for a corresponding electronic module 230.

Figure 3A:
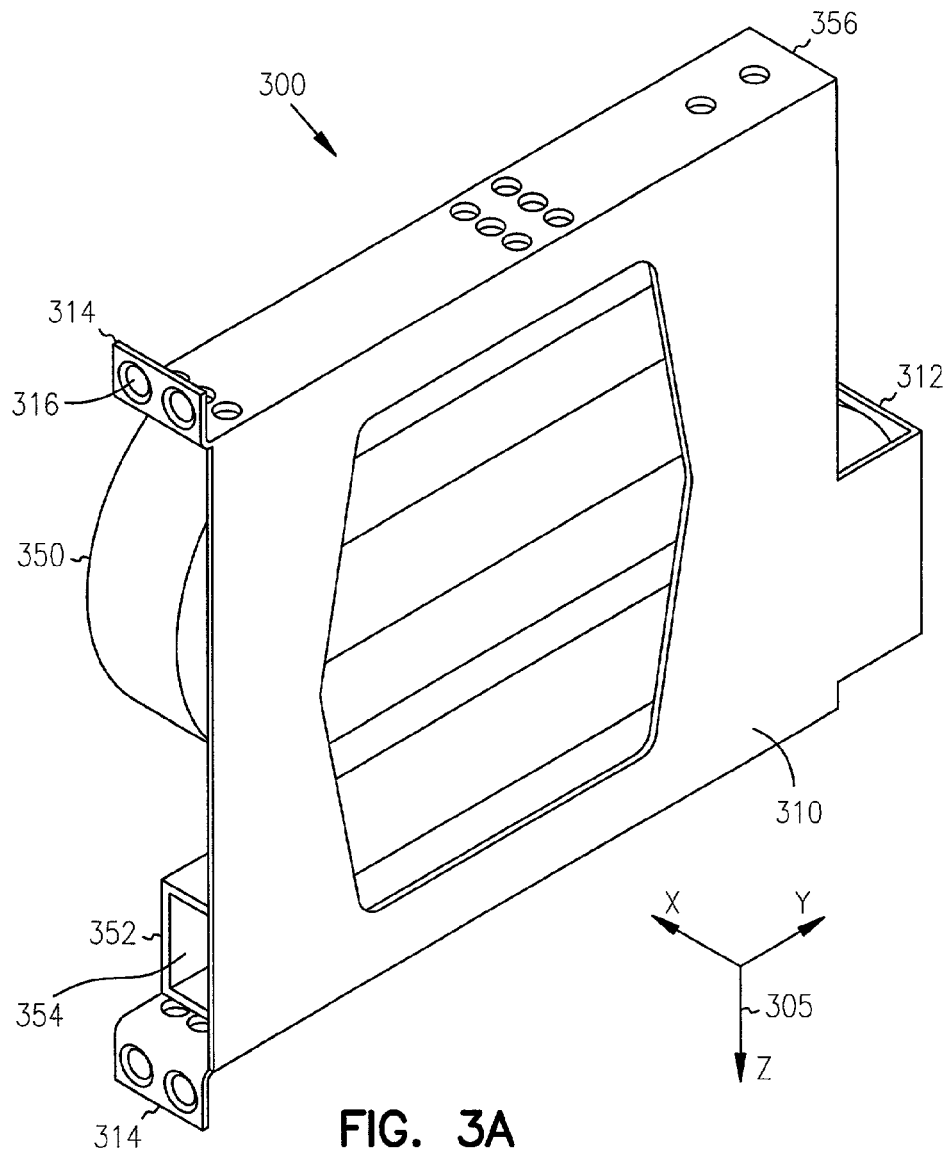
FIG. 3A shows a perspective view of an embodiment of a mounting system according to the invention.

FIG. 3A shows a wiring device 300. The wiring device 300 includes a guide frame 310 with mounts 314. In one embodiment, each mount 314 includes holes for screws 316, however as discussed above, other fasteners or attachment methods may be used in place of screws. Also shown is a flexible guide 350. The flexible guide 350 is adapted to accept a number of communication lines (not shown) along a central portion 352. In one embodiment, the flexible guide 350 is fixed to the guide frame 310 at a distal end 356, and the flexible guide is adapted for attachment to an avionic device at a proximal end 354. Referring to the coordinate axes 305 included in the Figure, the flexible guide 350 is allowed to flex in both the "y" direction and the "z" direction. The "y" and "z" directions define a two dimensional plane of movement. In one embodiment, the flexible guide 350 is limited to two dimensional movement. In the embodiment shown in FIG. 3A, the two dimensional plane of movement includes a vertically oriented plane defined by the "y" and "z" axes. Substantially no movement is allowed in the "x" direction in this embodiment.

One skilled in the art will recognize that other planes of movement are included within the scope of the invention. For example, a horizontally oriented plane is within the scope of the invention. A horizontally oriented plane of movement allows movement in the "x" and "y" directions, but substantially limits motion in the "z" direction.

Figure 3B:
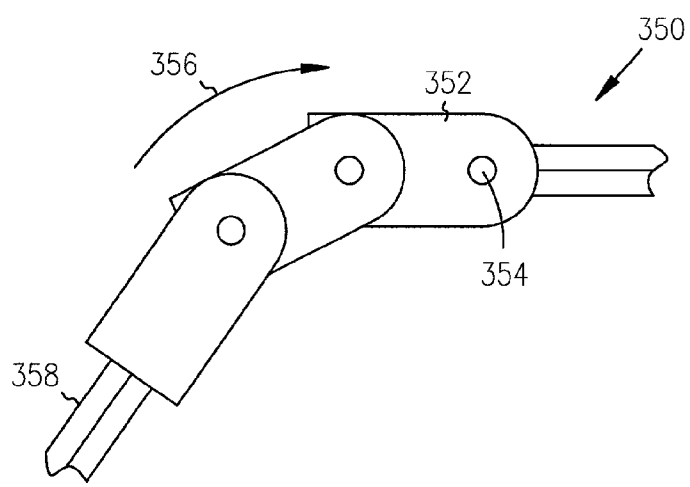
FIG. 3B shows a side view of a portion of one embodiment of a flexible guide according to the invention.

FIG. 3B shows one possible embodiment of a flexible guide 350 that limits motion to a two dimensional plane. A number of articulated joint segments 352 are included, each segment 352 including a joint 354. The joints 354 allow rotation in a two dimensional plane as shown by arrow 356, however the joints 354 substantially prohibit motion outside a rotation plane defined by rotation 356. For illustration, the flexible guide 350 as shown in FIG. 3B, is capable of rotation in the plane of the page, but is substantially prohibited form motion into or out of the plane of the page. A portion of a number of communication lines 358 are also shown in the Figure, guided along the flexible guide 350.

Figure 3C:
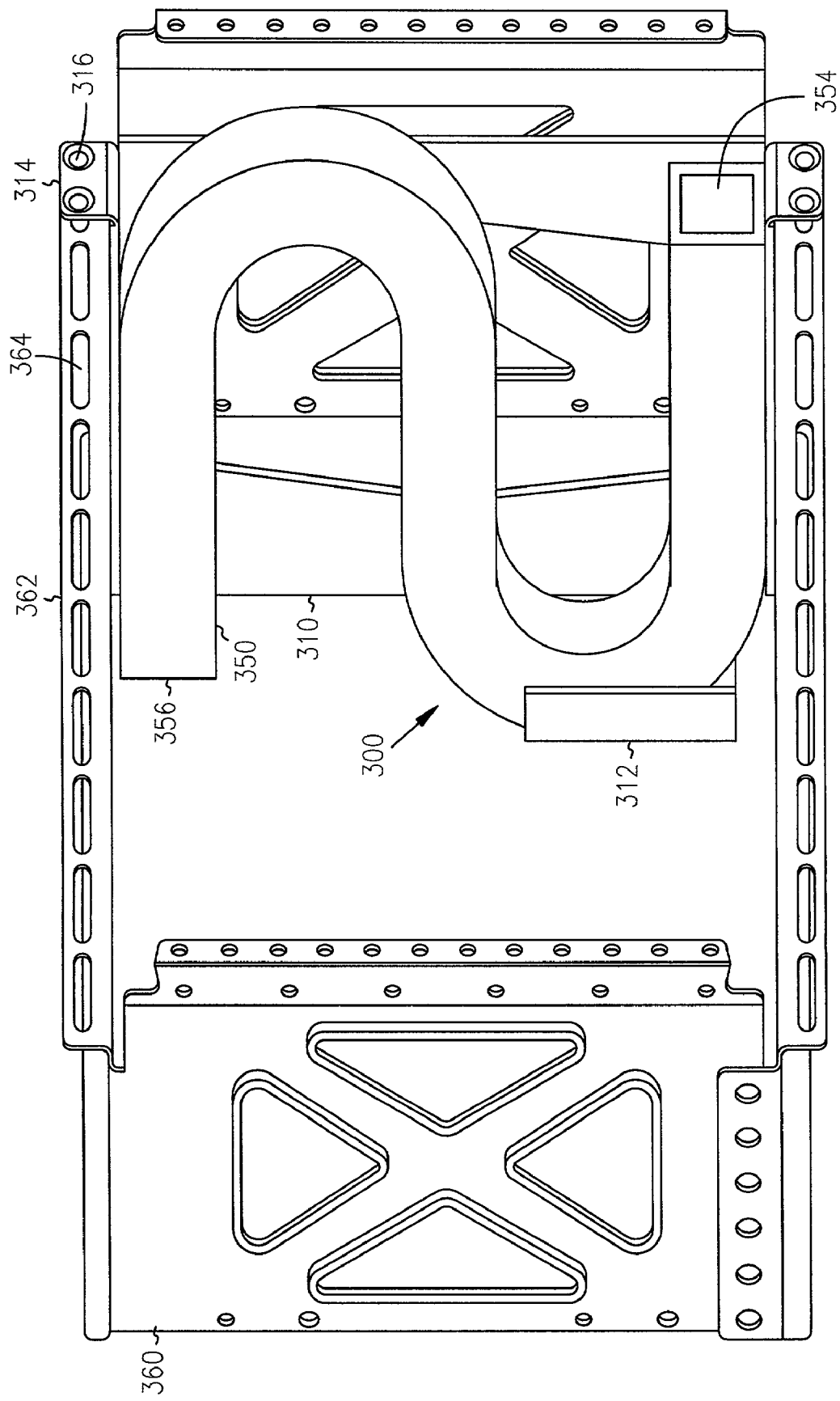
FIG. 3C shows a perspective view of multiple components of an embodiment of a mounting system according to the invention.

FIG. 3C shows the wiring device 300 attached to a mounting frame 360. The wiring device 300 is attached to a mounting surface 362 of the mounting frame 360 using the mounts 314 and associated holes 316 with a plurality of slots 364 on the mounting surface 362. Again, one skilled in the art will recognize that other types of fasteners or methods of mounting are included withing the scope of the invention. An "S" configuration of the flexible guide 350 is shown in FIG. 3C.

Also shown in FIG. 3C is a stop 312 attached to a portion of the guide frame 310. In one embodiment, the stop 312 is optionally included to further limit motion of the flexible guide 350 within its associated two dimensional plane of movement. As shown in the Figure, in one embodiment, the flexible guide 350 forms an "S" shape. One embodiment uses the stop 312 to limit motion of the "S" shaped flexible guide 350 by configuring the "S" to contact the stop 312 once a desired rearward amount of motion is achieved within the plane of movement. Several configurations of stops 312 are possible within the scope of the invention. The only requirement of the stop 312 is that it limit rearward motion of a plane of movement associated with the flexible guide 350.

Figure 3D:
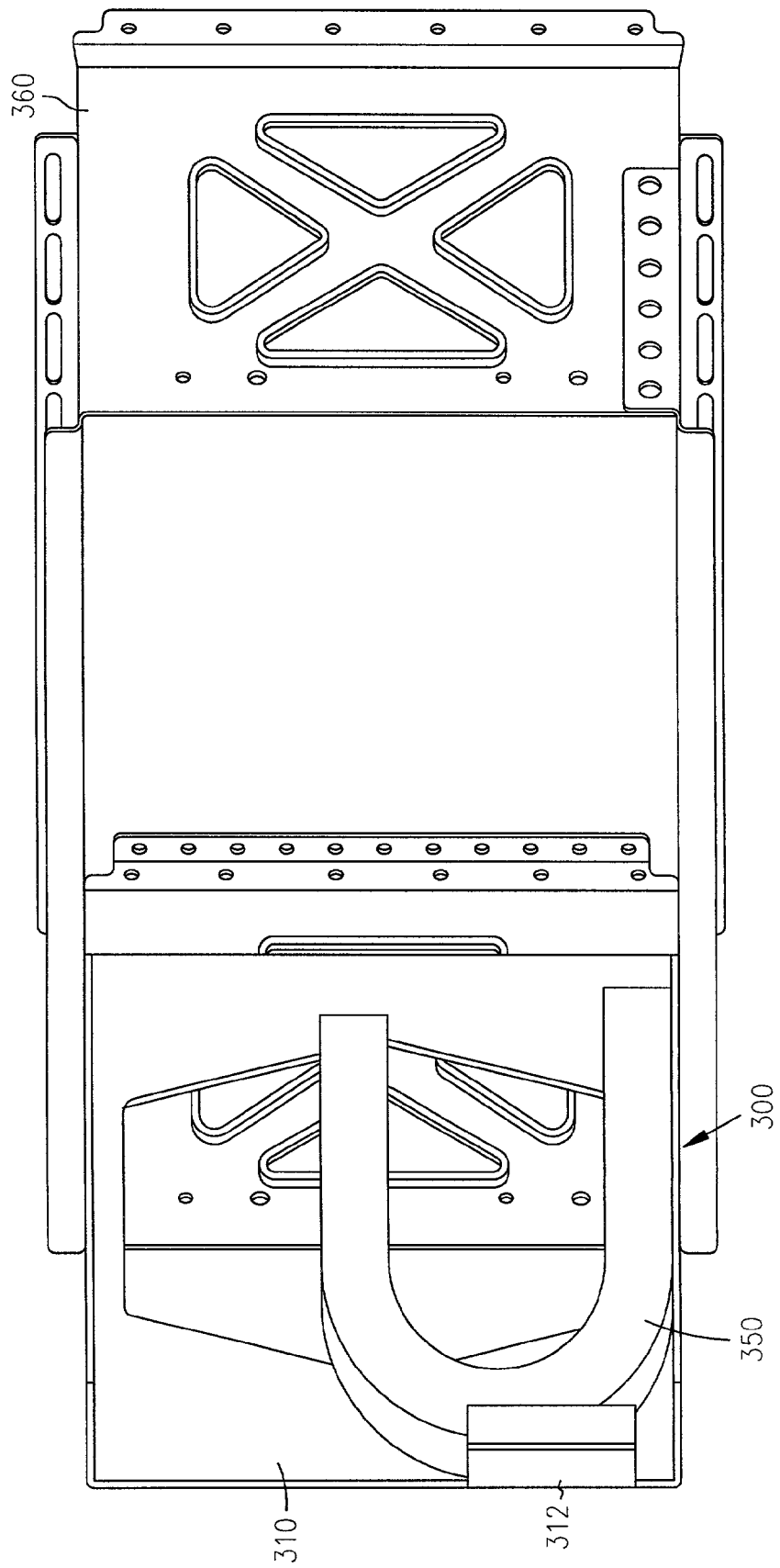
FIG. 3D shows a perspective view of another embodiment of multiple components of a mounting system according to the invention.

FIG. 3D shows another embodiment of the wiring system 300 attached to a mounting frame 360. The embodiment in FIG. 3D includes a flexible guide 350 that is configured in a "C" shape. One skilled in the art will recognize that several shapes of the flexible guide 350 are possible and included within the scope of the invention. The configurations of the "S" shown in FIG. 3C and the "C" shown in FIG. 3D are intended as two examples of possible configurations. Acceptable configurations of the flexible guide 350 are not so limited within the scope of the invention.

The preceding FIGS. 3A–3C have shown the flexible guide 350 in a retracted position within its associated plane of motion. Examples of a flexible guide in an extended or partially extended state are further shown in other embodiments detailed in the following Figures.

Figure 4:
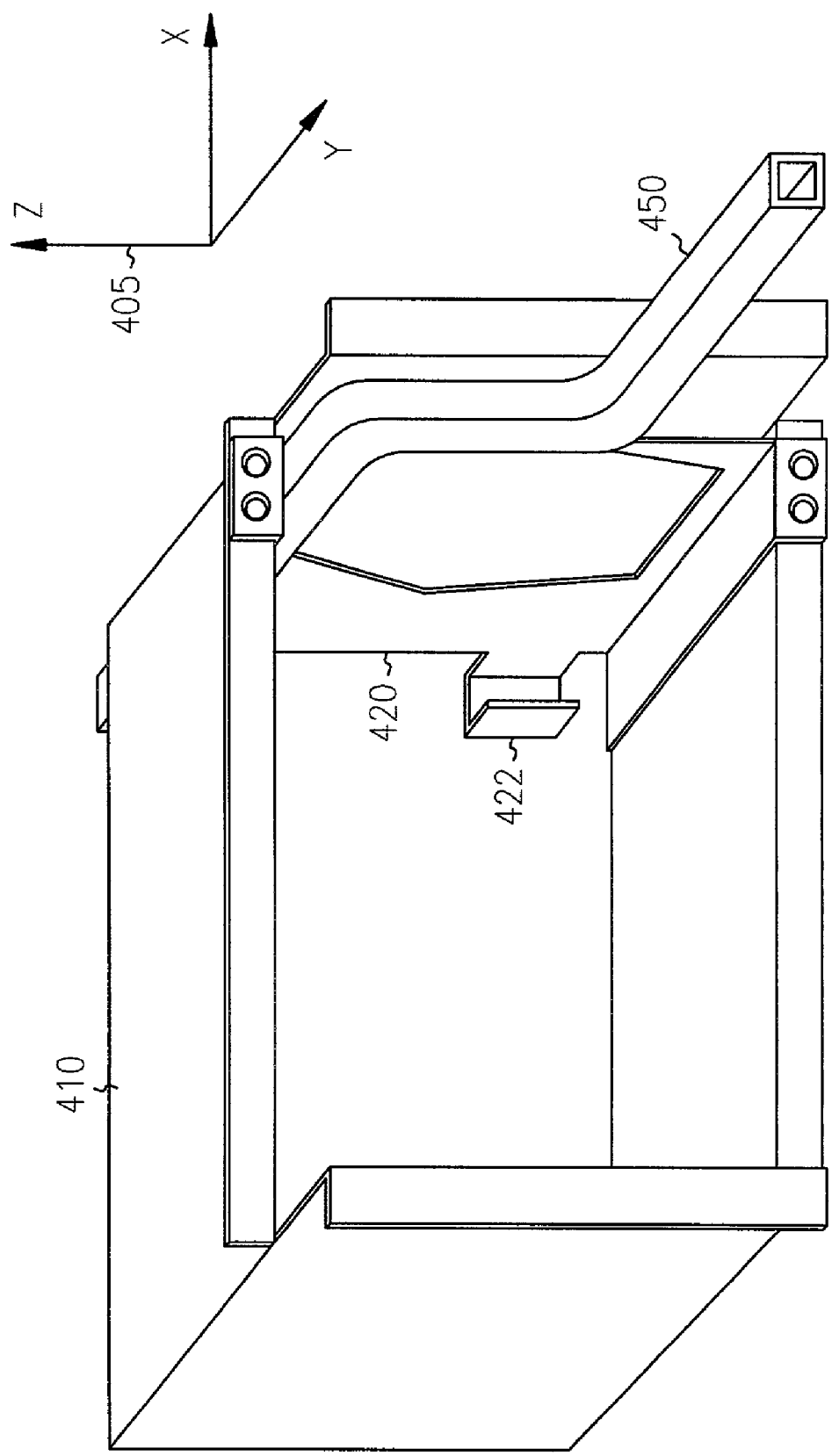
FIG. 4 shows a perspective view of an extended embodiment of a mounting system according to the invention.

FIG. 4 shows a guide frame 420 attached to a mounting frame 410. A flexible guide 450 is shown in a partially extended state. The flexible guide 450 shown in FIG. 4 is configured in an "S" shape when retracted. A stop 422 is also included in the embodiment of FIG. 4, the stop 422 being positioned to limit rearward travel of the flexible guide in a retracted state. Similar to embodiments described above, the flexible guide 450 shown in FIG. 4 is limited to motion in a two dimensional plane. Coordinate axes 405 indicate that the flexible guide 450 in this embodiment is limited substantially to a vertically oriented plane of motion in the "y" and "z" axes. As discussed above, other two dimensional planes are contemplated and the invention is not limited to vertically oriented planes of motion.

Figure 5:
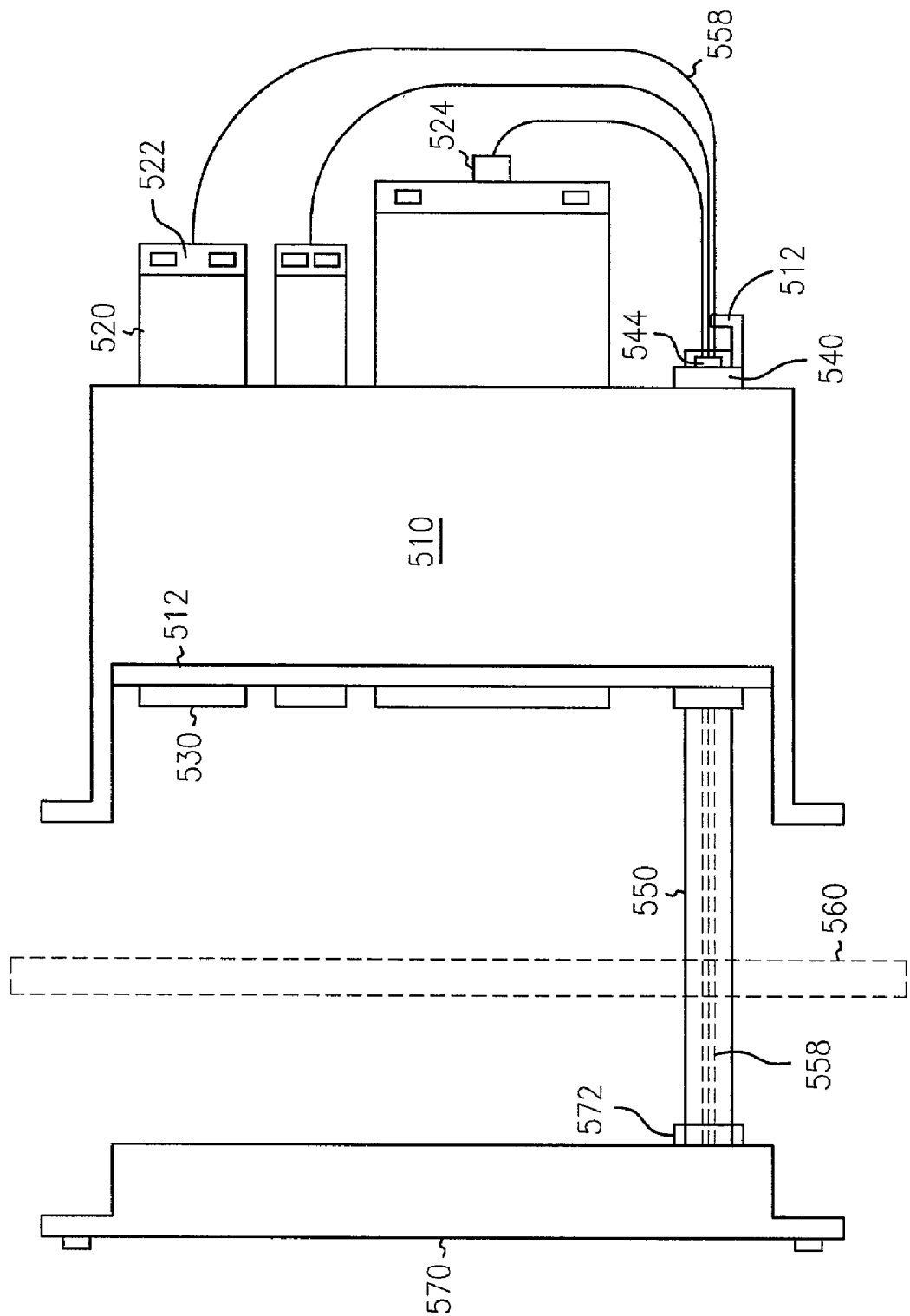
FIG. 5 shows a top view of an embodiment of a mounting system according to the invention.

FIG. 5 further shows a display unit 570 in front of an instrument panel 560 and a mounting frame 510 with unit frames 520 located behind the instrument panel 560. The unit frames 520 are attached to the mounting frame 510 along a mounting surface 512. Also shown are a number of communication lines 558 connected between the display unit 570 and the number of unit frames 520. The communication lines 558 are shown guided by a flexible guide 550 between the display unit 570 and a guide frame 540. In one embodiment, the communication lines 558 attach to a backplate 522 using a connector 524 such as a pin connector. A number of modules 530 are also shown contained by the unit frames 520.

The guide frame 540 in one embodiment includes a guide frame wiring connector 544 located on the guide frame. In one embodiment, communication lines 558 run from the display unit 570, along the flexible guide 550 to the guide frame wiring connector 544. The communication lines 558 are then conventionally wired between the guide frame wiring connector 544 and individual backplates 522. In one embodiment, the communication lines 558 are removably coupled to the display unit 570 by a display unit connector 572. In this configuration, the display unit 570 is easily disconnected from the flexible guide 550 and the number of communication lines 558 to allow further access to devices obstructed by the display unit 570.

When access to the modules 530 is desired, the display unit 570 is removed from the instrument panel 560. The novel wiring design of the invention allows the display unit 570 to be removed easily without cutting any cable ties. The flexible guide 550 extends from a retracted state along a two dimensional plane as described above. The display unit 570 can therefore be moved out of the way of the modules 530 to allow access. The modules can be repaired or replaced, and the display unit 570 is then returned to place without the need to re-tie any communication lines 558 with cable ties or similar retention devices.

Additionally, because the flexible guide 550 is only allowed motion in substantially a two dimensional plane, the communication lines 558 guided by the flexible guide 550 are held securely in place before, during, and after any access procedure. Damage or failure of communication lines is prevented by the structural support of the flexible guide 550, while at the same time, the display unit 570 may be easily removed to allow access to devices such as modules 530 located behind.

In addition to holding the communication lines 558 securely, the flexible guide 550 serves as a protective shield that prevents nicking or cutting of communication lines 558 due to inadvertent contact with any sharp surfaces that may exist in close proximity to the communication lines 558.

Figure 6:
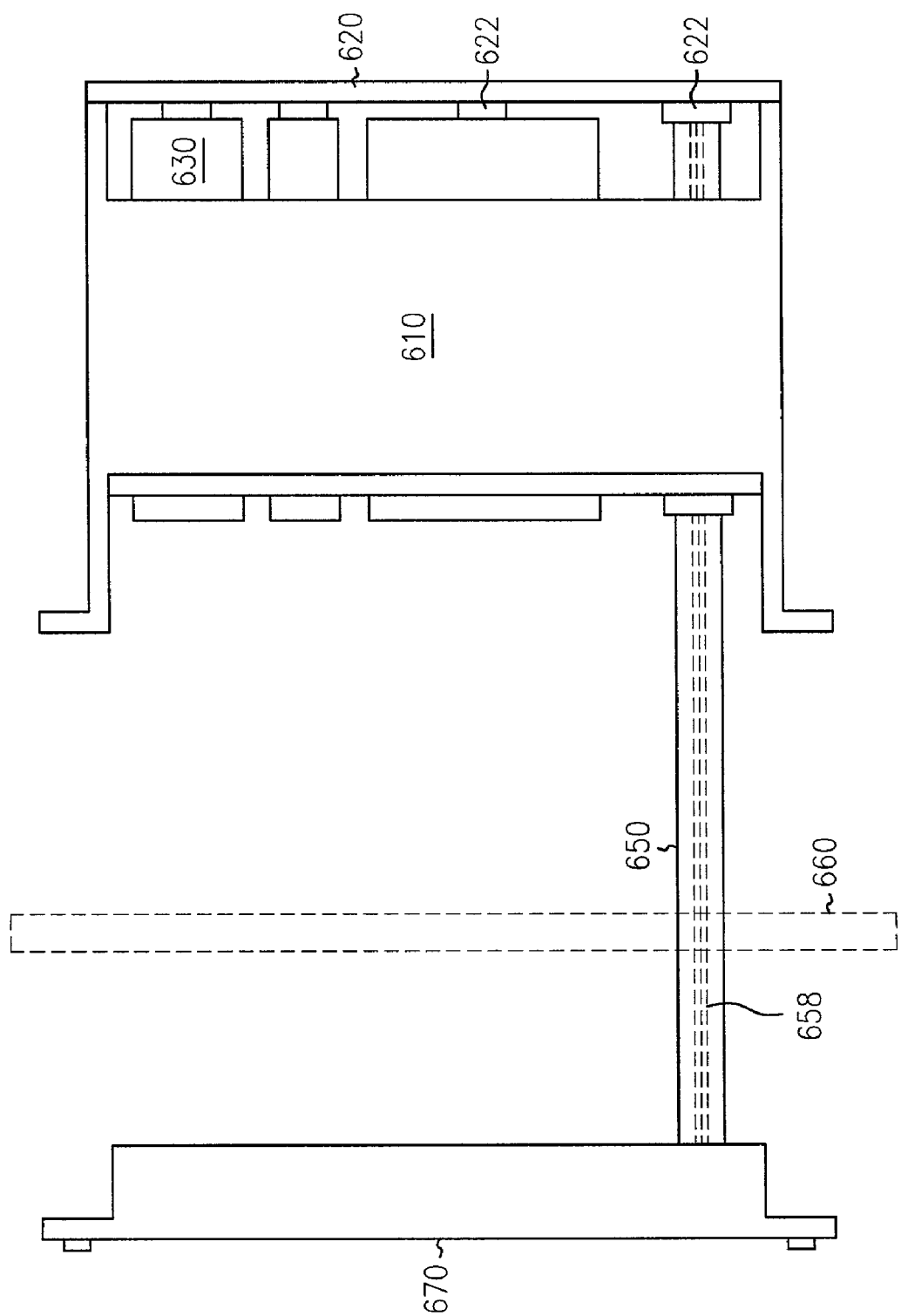
FIG. 6 shows a top view of another embodiment of a mounting system according to the invention.

FIG. 6 shows another embodiment of a mounting system according to the invention. A display unit 670 is shown in front of an instrument panel 660 and a mounting frame 610 with modules 630 located behind the instrument panel 660. Also shown are a number of communication lines 658 connected between the display unit 670 and the modules 630. The communication lines 658 are shown guided by a flexible guide 650 between the display unit 670 and a motherboard 620. In one embodiment, the communication lines 658 attach the motherboard 620 using one of a number of connector 622 such as a pin connector.

CONCLUSION

Thus has been shown a device and method for mounting and wiring avionic equipment such as modules and display units in an aircraft. The novel configuration utilizes a flexible guide that routes communication lines from a device such as a display unit to other devices such as avionic modules. One of the devices, such as a display unit is removable from one location to another without the need to cut any securing devices such as cable ties. Access is therefore easily gained to any device that a connected device is obstructing. In one example, a display unit is removable from in front of a number of avionic modules that are located behind the display unit, within an aircraft cockpit instrument panel.

Because the flexible guide is only allowed motion in substantially a two dimensional plane, the communication lines routed by the flexible guide are held securely in place before, during, and after any access procedure. Damage or failure of communication lines is prevented by the structural support of the flexible guide, while at the same time, the display unit may be easily removed to allow access to devices such as modules located behind.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An avionics instrument mounting system, comprising:
   a mounting frame attached to a mounting surface;
   an electronic module attached to the mounting frame;
   a display unit coupled to the electronic module by at least one communication line;
   a flexible guide coupled between the electronic module and the display unit, wherein the flexible guide limits communication line movement to substantially a two dimensional plane;
   a stop coupled to the mounting frame, the stop limiting the flexible guide to a depth within the mounting frame; and
   a flexible guide frame attached to the mounting frame along a range of mounting locations with respect to the mounting frame.

2. The avionics instrument mounting system of claim 1, wherein the range of mounting locations includes a horizontal range of mounting locations.

3. The avionics instrument mounting system of claim 1, wherein the stop is attached to the flexible guide frame.

4. The avionics instrument mounting system of claim 1, further including an electrical connector located on an end of the flexible guide and adjacent to the display unit, the electrical connector being accessible when the display unit is in an unmounted state and the flexible guide is in an extended state.

5. The avionics instrument mounting system of claim 1, wherein the mounting surface includes a cockpit instrument panel.

6. The avionics instrument mounting system of claim 1, further including a motherboard coupled between the electronic module and the flexible guide.

7. A method of mounting an avionics instrument system, comprising:
   attaching an electronic module to a mounting surface;
   coupling a display unit to the electronic module using at least one communication line;
   routing the communication line along a flexible guide coupled between the electronic module and the display unit, wherein the flexible guide limits communication line movement to substantially a two dimensional plane;
   directly connecting the display unit while the flexible guide is extended; and
   retracting the flexible guide to a position where the display unit is to be mounted.

8. The method of claim 7, wherein routing the communication line along the flexible guide includes routing the communication line along a flexible guide limiting communication line movement substantially to a vertical two dimensional plane.

9. The method of claim 7, wherein coupling a display unit to the electronic module includes coupling a flat panel screen to the electronic module.

10. The method of claim 7, wherein routing the communication line along the flexible guide includes routing along a jointed segmented flexible guide.

* * * * *